(12) United States Patent
Schuurmans et al.

(10) Patent No.: US 9,154,098 B2
(45) Date of Patent: Oct. 6, 2015

(54) AMPLIFIER CIRCUIT AND AMPLIFICATION METHOD

(71) Applicant: NXP B.V., Eindhoven (NL)

(72) Inventors: Han Martijn Schuurmans, Cuijk (NL); Maarten van Dommelen, Nijmegen (NL)

(73) Assignee: NXP B.V., Eindhoven (NL)

( * ) Notice: Subject to any disclaimer, the term of this patent is extended or adjusted under 35 U.S.C. 154(b) by 37 days.

(21) Appl. No.: 14/258,687

(22) Filed: Apr. 22, 2014

(65) Prior Publication Data

US 2014/0340147 A1    Nov. 20, 2014

(30) Foreign Application Priority Data

May 8, 2013  (EP) .................................... 13167118

(51) Int. Cl.
*H03G 3/30* (2006.01)
*G07C 9/00* (2006.01)
*H03F 3/45* (2006.01)

(52) U.S. Cl.
CPC ............ *H03G 3/301* (2013.01); *G07C 9/00309* (2013.01); *G07C 9/00571* (2013.01); *H03F 3/45071* (2013.01); *G07C 2009/00634* (2013.01); *G07C 2009/00777* (2013.01); *G07C 2009/00793* (2013.01); *H03F 2003/45008* (2013.01); *H03F 2200/03* (2013.01); *H03F 2203/45528* (2013.01); *H03F 2203/45588* (2013.01)

(58) Field of Classification Search
CPC ..................... H03F 1/14; H03F 1/34
USPC ................ 330/51, 85, 86; 381/94.5, 120, 121
See application file for complete search history.

(56) References Cited

U.S. PATENT DOCUMENTS

| | | | |
|---|---|---|---|
| 4,395,681 A | 7/1983 | Hornung et al. | |
| 6,114,980 A | 9/2000 | Tilley et al. | |
| 7,254,244 B2* | 8/2007 | Henson et al. | 381/120 |
| 2003/0148749 A1 | 8/2003 | Saito | |
| 2005/0168278 A1 | 8/2005 | Chung | |
| 2011/0018605 A1 | 1/2011 | Cho et al. | |
| 2012/0146719 A1* | 6/2012 | Mehr et al. | 330/51 |
| 2014/0112500 A1* | 4/2014 | Lesso | 381/121 |

FOREIGN PATENT DOCUMENTS

| | | |
|---|---|---|
| EP | 0 794 436 A1 | 9/1997 |
| EP | 2 323 254 | 5/2011 |
| WO | 01/65698 A1 | 9/2001 |
| WO | 2010/136578 A1 | 12/2010 |

OTHER PUBLICATIONS

Extended European Search Report for EP Patent Appln. No. 13167118.2 (Oct. 23, 2013).

* cited by examiner

*Primary Examiner* — Steven J Mottola

(57) ABSTRACT

A true ground amplifier circuit in which a voltage sensor senses the output voltage and generates a binary output which indicates whether the output is above or below a threshold. A variable gain feedback system generates a feedback signal for combination with the digital input, thereby to provide offset cancellation. The variable gain is reduced over time to provide offset cancellation during an initial period of time of operation of the amplifier circuit. This provides offset cancellation during a start-up period, for example.

15 Claims, 4 Drawing Sheets

AMPLIFIER CIRCUIT AND AMPLIFICATION METHOD

CROSS-REFERENCE TO RELATED APPLICATIONS

This application claims the priority under 35 U.S.C. §119 of European patent application no. 13167118.2, filed on May 8, 2013, the contents of which are incorporated by reference herein.

This invention relates to amplifier circuits, and in particular to amplifiers for providing offset cancellation for loudspeaker signals (such as headphones), and more particularly to true ground amplifier circuits.

A loudspeaker can be connected to an amplifier through a capacitor, in a so-called AC-coupled system. Alternatively, a digital audio headphone amplifier can have the loudspeaker directed connected to the output of the amplifier. The amplifier output signal is then referenced to ground, and this arrangement uses a so-called true ground amplifier, as shown in FIG. 1.

The input signal to the amplifier 1 is received from a digital to analogue converter (DAC) 2. The DAC is referenced to ground, and operates only in the positive voltage domain. The speaker 11 is connected between ground and the amplifier output.

The DAC has a differential output of a common mode current Idaccom and a different current Idacdiff. The common mode current determines the voltage at one input of the amplifier, by conduction through a virtual ground resistor 3. The resistor is sized such that the common mode current (which is essentially constant) results in a voltage drop of 0.5 Vdd.

The difference current drives the amplifier, which has a feedback resistor 4 of the same value as the virtual earth resistor 3.

In a mute setting, the differential current is equal to the common mode current, so that the same 0.5 Vdd voltage drop arises across the feedback resistor, and the amplifier output is zero. Thus, the amplifier output is centred around zero, and for this reason the amplifier requires a positive and negative voltage supply.

The combination of the offset of the amplifier, mismatch of the feedback and virtual ground resistor, mismatch between the DAC positive and negative currents and other imperfections results in a DC offset voltage at the output across the speaker.

By proper matching of resistors and transistors, DC offset of a few mV can be achieved, but even 1 mV can result in a plop and click effect when switching on/off the amplifier.

It is known to address the plop and click problem by using a soft switching approach, or by using dynamic element matching and chopping amplifiers in order to keep the offset low. Also, using an analogue to digital converter for digitizing the amplifier output followed by a low pass filter is a possible way to remove DC-offset.

These known approaches require additional circuitry and signal processing, which is undesirable.

US 2011/0116653 discloses an amplifier in which the output stage is split between a primary output stage and a secondary output stage. It also discloses a DC offset cancelling circuit, in which comparison of the output with true ground is used to generate an error signal, which is filtered and amplified before being subtracted from the input.

A problem with the control of such a DC offset cancelling circuit is that different control is desirable at different times, and in a way which is not perceptible to the user when the amplifier is in use.

The invention is defined by the claims.

According to the invention, there is provided an amplifier circuit comprising:
a digital to analogue converter;
an amplifier for amplifying the analogue signal, and having a feedback impedance, an output from the amplifier for connection to an output load,
wherein the circuit further comprises:
a voltage sensor for sensing the output voltage and generating a binary output which indicates whether the output is above or below a threshold;
a variable gain feedback system for generating a feedback signal for combination with the digital input, thereby to provide offset cancellation; and
a controller for controlling the variable gain, wherein the controller is adapted to reduce the gain over time between at least two non-zero values to provide offset cancellation during an initial period of time of operation of the amplifier circuit.

The amplifier can be an audio amplifier.

The invention provides a feedback mechanism that measures the output voltage in a simple way (for example with a single comparator as analogue element) and combines (e.g. subtracts) this with the digital input. All the factors that contribute to dc-offset can be cancelled out.

The comparator can have a threshold of 0V and thus measures if the amplifier output level is above or below ground level. The feedback loop adjusts the DC input signal such that the output signal is moved to 0V. This will work without the load being used (e.g. music played to a load in the form of a speaker), but it can work when using the load (e.g. playing music at the same time).

Over time, the output can be analysed to confirm that over a long time the average signal is equally above and below zero when there is no DC component in the output signal (e.g. music).

The digital to analogue converter can have a differential output, and the amplifier is for receiving one of the differential output signals of the digital to analogue converter to one input and the other to another input. The difference between the differential signals is thus amplified. The digital to analogue converter can be for converting a digital input signal into an analogue common mode current signal and an analogue differential mode current signal.

The invention provides an adjustable loop gain which can be automated such that the speed of settling is reduced from fast to slow during start-up. Fast settling can be tolerated during start-up whereas slow settling is used during use, for example to avoid audible plop noise.

The variable gain feedback system preferably includes a gain element and an integrator for integrating the output of the gain element. A circuit can then be provided for counting the integrator cycles and varying the gain at timing dependent on the counting circuit.

In one arrangement, the controller is adapted to change the gain at timing points when the integrator output is mid-way between minimum and maximum output levels. The controller can change the gain at timing points every predetermined number (e.g. 2) of crossings of the integrator output with the mid-way between minimum and maximum output levels.

The variable gain feedback system can have a fixed number of variable gain settings, such as 2, 3, 4 or 5.

In one arrangement, there is a primary stage and a secondary stage, wherein the primary stage is disabled during the switching on of the amplifier arrangement, and the secondary stage is turned on in graduated manner, wherein the primary stage is enabled only after the offset cancellation (i.e. after the dc offset is removed). The voltage sensor and variable gain feedback system is part of the secondary stage during start-up. After start-up the voltage sensor and variable gain feedback is part of the primary stage.

The amplifier circuit can be used in a loudspeaker circuit.

The invention also provides a method of signal amplification, comprising:

converting a digital signal into an analogue signal;
amplifying the analogue signal
sensing the output voltage and generating a binary output which indicates whether the output is above or below a threshold;
generating a feedback signal for combination with the digital input, thereby to provide offset cancellation; and
controlling a variable gain of the feedback signal between at least two non-zero values by reducing the gain over time to provide offset cancellation during an initial period of time of operation of the amplifier circuit.

An example will now be described in detail with reference to the accompanying drawings, in which.

The invention provides a true ground amplifier circuit in which a voltage sensor senses the output voltage and generates a binary output which indicates whether the output is above or below a threshold. A variable gain feedback system generates a feedback signal for combination with the digital input, thereby to provide offset cancellation. The variable gain is reduced over time to provide offset cancellation during an initial period of time of operation of the amplifier circuit. This provides offset cancellation during a start-up period, for example. The gain is adjusted between at least two non-zero values, which correspond to different speeds of DC offset cancellation. These different speeds can be applied at different times, depending on whether an audible effect on the output may be tolerated (for example in a mute mode) or not.

Figure 2:
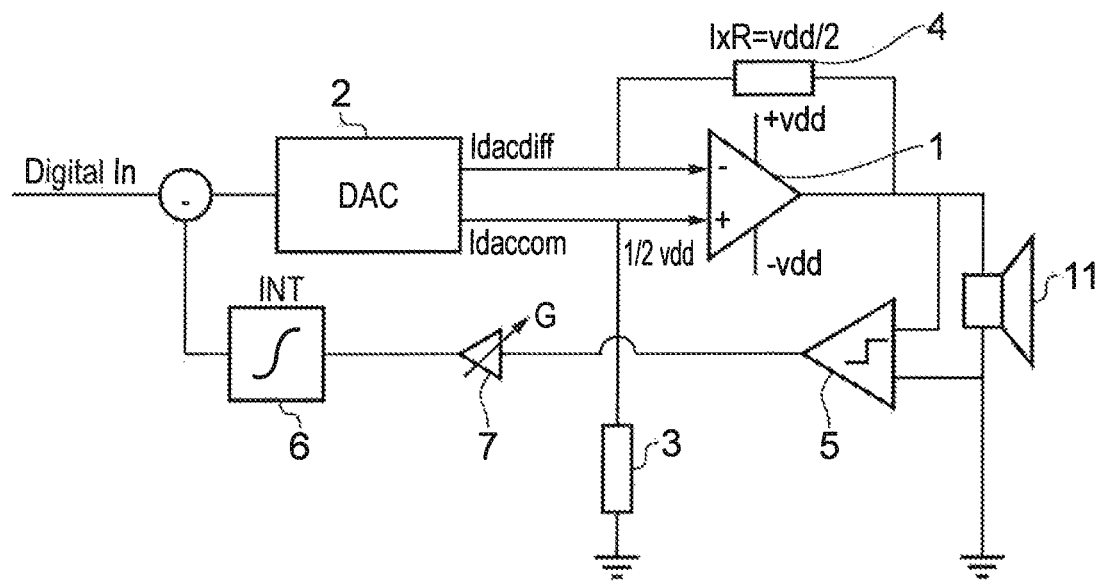
FIG. 2 shows a first example of true ground loudspeaker amplifier of the invention.

FIG. 2 shows an example of a circuit of the invention.

Figure 1:
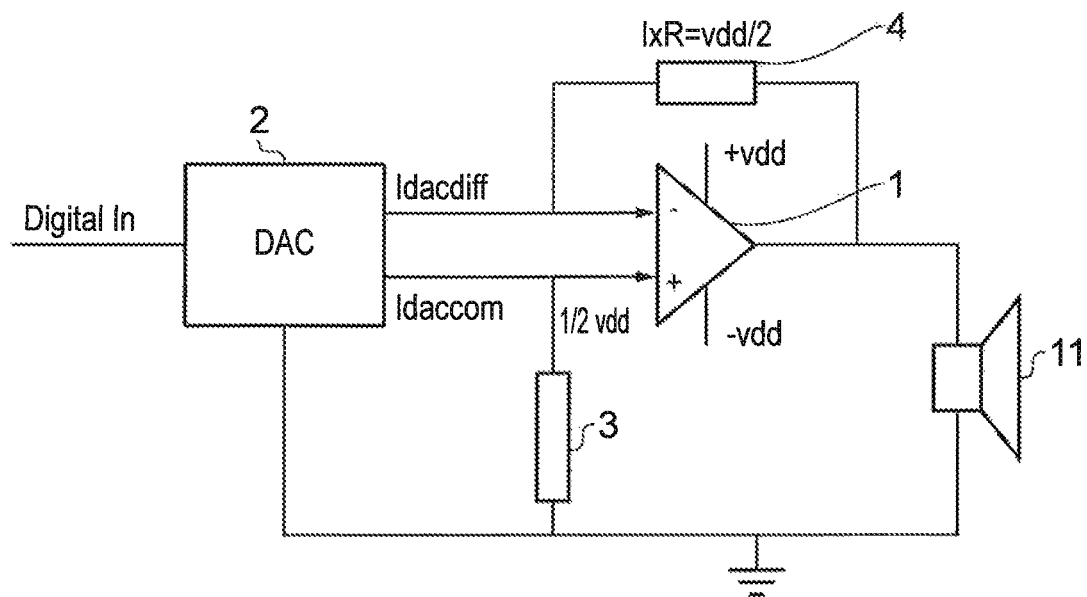
FIG. 1 shows a known true ground loudspeaker amplifier.

The circuit comprises the DAC 2, amplifier 1, ground resistor 3, feedback resistor 4 and speaker 11 as in FIG. 1.

In addition, the circuit comprises a comparator 5 for comparing voltage signals on opposite sides of the speaker (i.e. the amplifier output and ground) and an integrator 6. The comparator is thus one possible implementation of the voltage sensor, since it compares the amplifier output with ground. The integrator can be seen as an up/down counter.

The integrator counter counts up as long as the amplifier output is greater than zero. It counts down as long as the amplifier output is less than zero.

The speed of counting up/down depends on the gain of the sensor, which can be controlled by an adjustable gain element 7 with gain G.

This invention relates in particular to the control of the gain element 7.

At start-up, the gain G will be high such that the DC-offset is cancelled in a short time, such as less than 10 ms.

When DC-offset cancellation is achieved the adjustable gain G can in theory be set to G=Gdccan=0 thereby switching the feedback loop to a static state.

In order to keep track of slow moving effects for example due to temperature dependency it is better to take Gdccan≠0, but set it to a value low enough that it does not influence the low frequency content of the incoming music signal.

Taking the lower side of the audio frequency band, being 20 Hz, will result in a 25 ms up duration and a 25 ms down duration. The output amplitude of the up/down counter should for example be limited to Uoint=10 uV (where Uoint denotes the voltage U at the output of the integrator), in order to achieve a distortion of less than −100 dB while the output signal of the amplifier has an amplitude of 1 Vrms.

Depending on the sample rate fs, the gain G can be calculated.

$$fs = 44.1 \text{ kHz}$$
$$fsig = 20 \text{ Hz}$$
$$Uoint = 10uV$$
$$Gdccan < \frac{Uoint}{Steps} = \frac{2 \cdot Uoint \cdot fsig}{fs} = 9 \cdot 10^{-9}$$

If this value is used at start-up with an initial offset of Uoffinit=100 mV, it would take $10^7$ steps and result in 250 second start-up time.

Offset cancellation should be reached in Ts=10 ms. This means that Gstup should be set to $$Gstup > \frac{Uoffinit}{Steps} = \frac{Uoffinit}{Ts \cdot fs} = 2.3 \cdot 10^{-3}$$

This means that at start-up a higher value of the gain G is needed and that during settling, the value of G can be reduced.

Changing G is a critical task. Reducing G after start-up at the wrong time could result in that it still takes a long time to settle completely.

In order to change G an algorithm is used to determine the right time for reduction.

Figure 3:
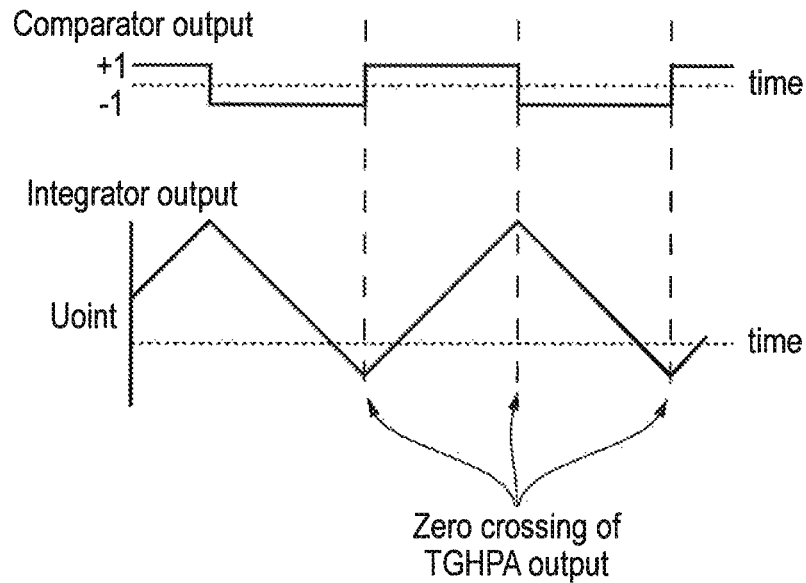
FIG. 3 shows one possible timing diagram for the circuit of FIG. 3.

FIG. 3 shows the integrator output, based on the example of comparator signal shown.

When the amplifier output crosses zero, the comparator will flip sign and the integrator will change its direction. By determining the minimum and maximum value of the integrator, a more accurate estimate can be made of the DC offset.

$$DCoffset\_estimate = \frac{Uoint(\max - \min)}{2}$$

The most appropriate time to reduce the gain value G is when the integrator is exactly in the middle between the maximum and minimum value, because this corresponds to the estimated DC offset value.

Thus, a minimum and maximum detector and comparator can be used to determine the correct times to change the gain value G.

Figure 4:
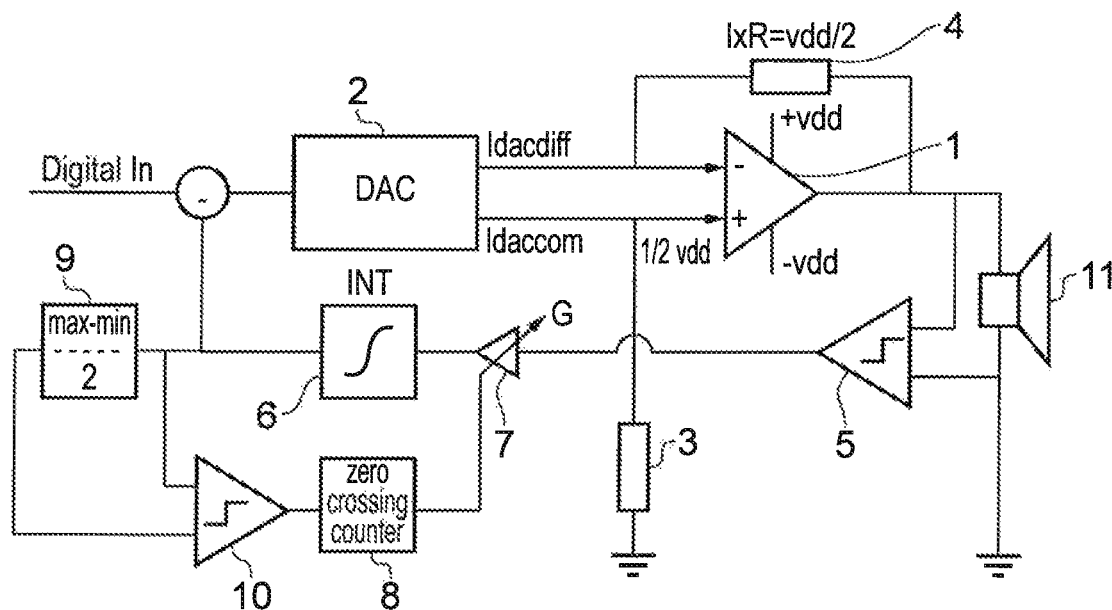
FIG. 4 shows a second example of true ground loudspeaker amplifier of the invention.

FIG. 4 shows the circuit of FIG. 2 with the additional elements to control the gain value.

A so-called zero crossing counter 8 is used to count how many times the amplifier output crosses zero based on the integrator output crossing the value max-min/2, as determined by the detector 9. The integrator output is compared with this mid level by comparator 10.

Changing the gain G can be done after an adjustable zero crossing count. It is also possible to have more than two gain settings. Furthermore, the zero crossing counter gives information when the cancellation is completed and can be used to un-mute the amplifier.

Figure 5:
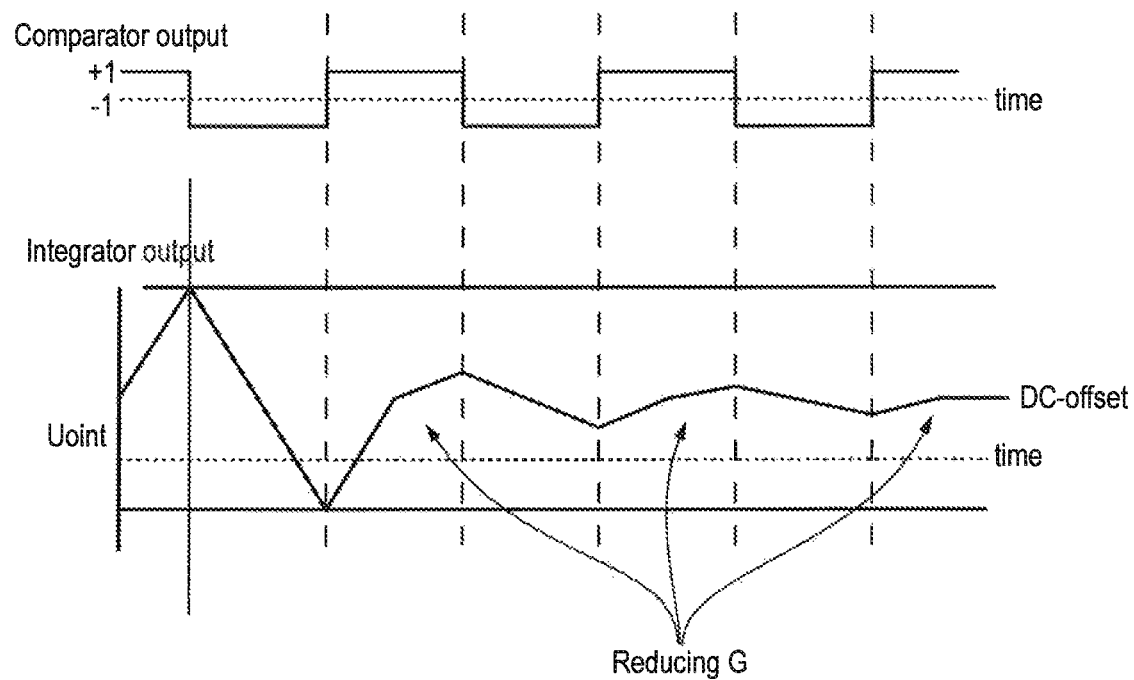
FIG. 5 shows one possible timing diagram for the circuit of FIG. 4.

FIG. 5 shows four gain settings G which change after every other zero crossing count.

The change in gain setting can be seen as it causes a change in the slope of the integrator output. In the example shown, there is a decrease in slope at each timing instant. The timing is mid-way between the transition events of the comparator output.

As mentioned above, US 2011/0116653 discloses an amplifier in which the output stage is split between a primary output stage and a secondary output stage.

Figure 6:
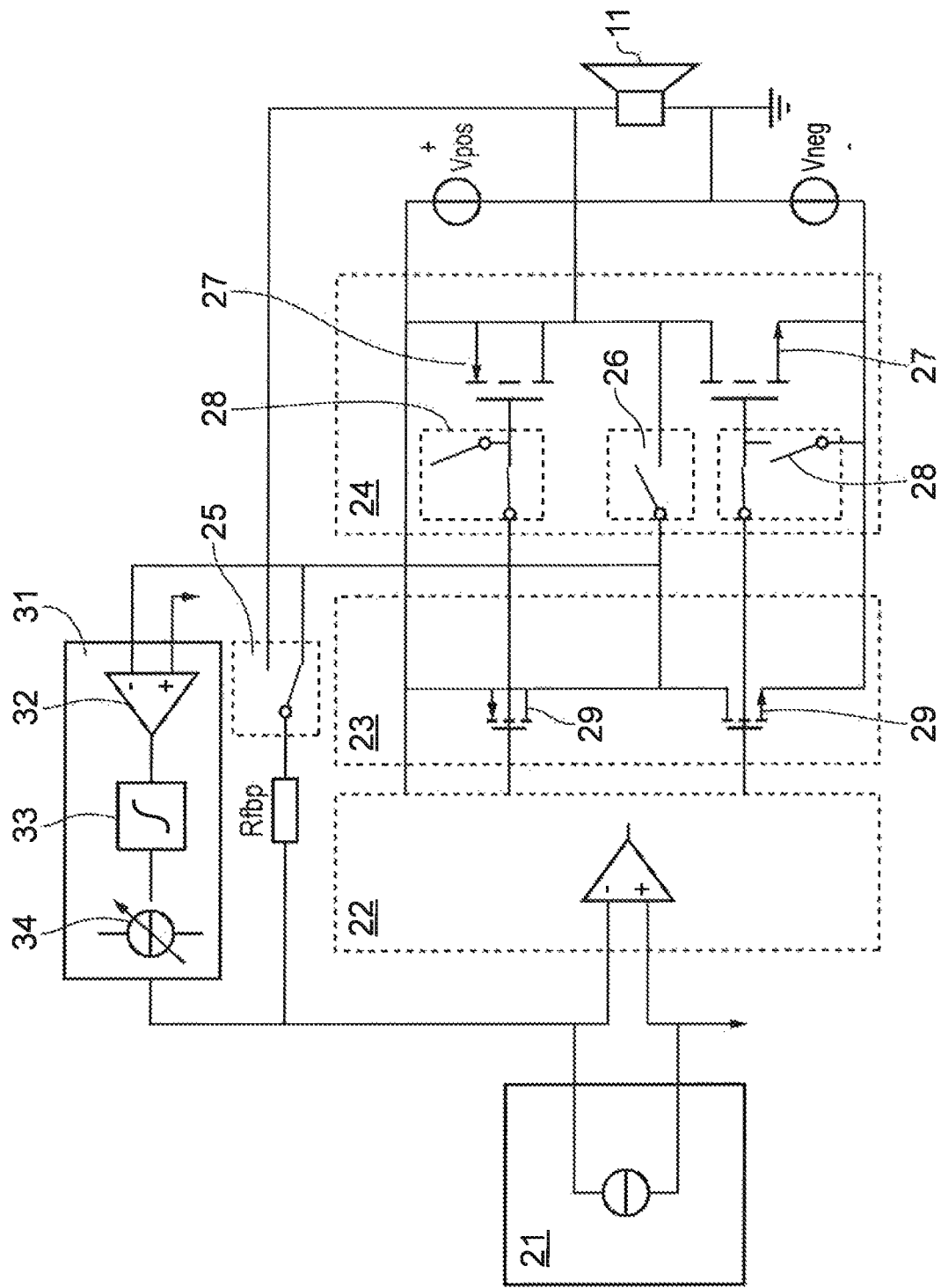
FIG. 6 shows a further known example of true ground loudspeaker amplifier to which the control of the invention can be applied.

FIG. 6 is taken from US 2011/0116653.

The signal to be amplified is connected to a primary output stage 24 and a secondary output stage 23. The primary stage 24 comprises a pair of transistors 27, and the secondary stage a pair of transistors 29. The output of primary output stage 24 is connected to speaker 11. A switch 25 connects the feedback loop from either the secondary stage 23 or the primary output stage 24 to the input via feedback resistor Rfbp. The primary output stage includes a control switch 26, which switchably connects the output from the secondary stage 23 to the midpoint node between the two primary stage transistors 27.

The gate controls of primary stage transistors 27 are respectively under the control of further switches 28.

In operation, the primary output stage is disabled by means of switches 28. The speaker can then be "soft connected", or gradually connected to the secondary stage 23 to allow a slow charging the speaker load. Provided that this charging is sufficiently slow to fall outside the audio frequency band, a plop will not be audible in the speaker. In order to "soft connect" or gradually connect the secondary stage to the output, the switch 26 is gradually changed from a fully off state to a fully on state. The gradual change is effected by means of pulse width modulation (PWM) of the switch. The on-time of the PWM switch 26 is slowly changed from 0% to 100%; this can result in a relatively slow charging at a rate and shape that will not give an audible plop of the speaker.

In the case that the shape has the form of a cosine curve from 0-180 degrees, a fast switch on (or, equivalently, switch-off) time can be realised without any audible plop.

Once the secondary stage and speaker settle, the primary stage can be enabled by turning on switches 28.

As shown in FIG. 6, there is separate feedback loop to the input, from each of the secondary stage 23 and the primary output stage 24. Switch 25 is used to select between these two feedback loops. When the primary output stage is enabled, the primary output is fed back to the input. However, during the transition stages, the secondary output is used as the feedback signal.

FIG. 6 shows a true ground configuration in which the speaker is DC coupled between the output of the primary output stage 24 and ground. The amplifier arrangement is balanced around ground, with a positive supply Vpos and negative supply Vneg.

The DC offset is cancelled by means of the DC offset cancelling arrangement 31, which has the structure outlined above, of a comparator 32, integrator 33 and amplifier 34. The resulting signal is subtracted from the input, resulting in a reduction or removal of the DC offset.

During the switching on of the amplifier arrangement, the primary output stage 24 is disabled. The secondary output stage 23 is used to remove the DC offset. Once the DC offset is removed, the primary stage is enabled by means of switches 28.

Thus, during a start-up mute time period, only the secondary output stage 23 is used.

The gain adjustment of the invention can take place during this time period to rapidly provide fast settling of the feedback loop, so that the amplifier is ready for normal operation when the primary output stage 24 is used. The DC offset cancellation circuit is thus associated with the secondary stage.

The voltage sensor and variable gain feedback system is part of the secondary stage during start-up. After start-up the voltage sensor and variable gain feedback is part of the primary stage.

This invention can be included in line driver, headphone amplifiers and speaker amplifiers. The automated adjustable loop gain controlled with gain G has the advantage that the loop delay caused by signal processing, DAC, TGPHA (True Ground Headphone Amplifier) has no effect on loop stability. The delay will only result in larger excursion of the integrator and as consequence a longer period of control The DC offset at the output of a headphone amplifier will cause a DC current to flow that reduces play time of a mobile device. DC offset also is the cause of clicks and plops when switching on the headphone amplifier. The DC offset is caused by the input stage where mismatch in transistor and bias currents easily result in more than 1 mV DC offset at the output.

This invention reduces the DC offset by measuring the output voltage, in a preferred example by means of a single comparator, and by using a digital control function that subtracts a value from the DAC input signal such that the average output voltage (the DC offset) becomes less than 100 uV.

The invention has been described in connection with an audio amplifier. However, it can also be used for other ac signals where low offset is needed.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An amplifier circuit comprising:
   a digital to analogue converter;
   an amplifier for amplifying the analogue signal, and having a feedback impedance, an output from the amplifier for connection to an output load,
   wherein the circuit further comprises:
   a voltage sensor for sensing the output voltage and generating a binary output which indicates whether the output is above or below a threshold;
   a variable gain feedback system for generating a feedback signal for combination with a digital input, thereby to provide offset cancellation; and
   a controller for controlling the variable gain, wherein the controller is adapted to reduce the gain over time between at least two non-zero values to provide offset cancellation during an initial period of time of operation of the amplifier circuit.

2. A circuit as claimed in claim 1, wherein the digital to analogue converter has a differential output, and the amplifier is for receiving one of the differential output signals of the digital to analogue converter to one input and the other differential output signal to another input.

3. A circuit as claimed in claim 2, wherein digital to analogue converter is for converting a digital input signal into an analogue common mode current signal and an analogue differential mode current signal, wherein the common mode current signal is provided to one input and the differential mode current signal is provided to the other input of the amplifier.

4. A circuit as claimed in any preceding claim, wherein the variable gain feedback system includes a gain element and an integrator for integrating the output of the gain element.

5. A circuit as claimed in claim 4, further comprising a circuit for counting the integrator cycles and varying the gain at timing dependent on the counting circuit.

6. A circuit as claimed in claim 4, wherein the controller is adapted to change the gain at timing points when the integrator output is mid-way between minimum and maximum output levels.

7. A circuit as claimed in claim 6, wherein the controller is adapted to change the gain at timing points every predetermined number of crossings of the integrator output with the mid-way between minimum and maximum output levels.

8. A circuit as claimed in claim 7, wherein the predetermined number is two.

9. A circuit as claimed in claim 1, wherein the voltage sensor comprises a comparator.

10. A circuit as claimed in claim 1, comprising a subtractor for subtracting the feedback signal from the digital input.

11. A circuit as claimed in claim 1, wherein the variable gain feedback system has a fixed number of gain settings.

12. A circuit as claimed in claim 1, comprising a primary stage and a secondary stage, wherein the primary stage is disabled during the switching on of the amplifier arrangement, and the secondary stage is turned on in graduated manner, wherein the primary stage is enabled only after the offset cancellation.

13. A loudspeaker circuit comprising an amplifier circuit as claimed in claim 1, and a loudspeaker connected to the output.

14. A method of signal amplification, comprising:
converting a digital signal into an analogue signal;
amplifying the analogue signal
sensing the output voltage and generating a binary output which indicates whether the output is above or below a threshold;
generating a feedback signal for combination with a digital input, thereby to provide offset cancellation; and
controlling a variable gain of the feedback signal between at least two non-zero values by reducing the gain over time to provide offset cancellation during an initial period of time of operation of the amplifier circuit.

15. A method as claimed in claim 14, comprising disabling a primary stage of an amplifier during the switching on of the amplifier, and turning on a secondary stage of the amplifier in graduated manner, enabling the primary stage only after the offset cancellation.

* * * * *